United States Patent [19]

Suzuki

[11] Patent Number: 5,332,694
[45] Date of Patent: Jul. 26, 1994

[54] PROCESS FOR MANUFACTURING A SEMICONDUCTOR DEVICE

[75] Inventor: Mieko Suzuki, Tokyo, Japan

[73] Assignee: NEC Corporation, Tokyo, Japan

[21] Appl. No.: 21,076

[22] Filed: Feb. 23, 1993

[30] Foreign Application Priority Data

Feb. 26, 1992 [JP] Japan ............... 4-038926

[51] Int. Cl.$^5$ ............................. H01L 21/44
[52] U.S. Cl. .................... 437/195; 437/189; 437/194; 437/197; 437/203
[58] Field of Search ............ 437/195, 194, 203, 189, 437/197, 198, 228

[56] References Cited

U.S. PATENT DOCUMENTS

| | | | |
|---|---|---|---|
| 4,894,351 | 1/1990 | Batty | 437/195 |
| 4,970,177 | 11/1990 | Mizusaima | 437/195 |
| 5,091,340 | 2/1992 | Mizushima | 437/195 |
| 5,143,860 | 9/1992 | Mitchell et al. | 437/195 |
| 5,155,064 | 10/1992 | Mise | 437/195 |
| 5,169,801 | 12/1992 | Sato | 437/195 |

OTHER PUBLICATIONS

"Interlevel Dielectric Planarization With Spin-On Glass Films", CH 2337-4/86/0000-0506 C 1986 IEEE, by Landon B. Vines and Satish K. Gupta, Jun. 9-10, 1986 V-MIC Conf., pp. 506-515.

"A Highly Reliable Multilevel Interconnection Process for 0.6 m Cmos Devices", UTH-0359-0/91/0000-0013 C 1991 IEEE, by Y. Takata et al. Jun. 11-12, 1991 VMIC Conference, pp. 13-19.

*Primary Examiner*—Tom Thomas
*Assistant Examiner*—Kevin M. Picardat
*Attorney, Agent, or Firm*—Young & Thompson

[57] ABSTRACT

A process for manufactoring a semiconductor device having a double- or multi-level interconnection structure is disclosed. The process includes steps of: forming a first level metal interconnect; then forming a first silicon oxide layer by PECVD, and forming a second silicon oxide layer by atmospheric CVD using tetraethoxysilane and oxygen containing ozone under a condition of excess ozone in which the ratio of flow-rate of ozone to flow-rate of tetraethoxysilane is about 20:1. An organic compound coating layer is formed by spin-coating accompanied by a thermal treatment. The organic compound coating layer and the second silicon oxide layer are etched-back to remove the compound oxide layer completely. A third silicon oxide layer is formed by PECVD; and forming a second level metal interconnect. A good planarization can be obtained and a failure, such as delamination or blister due to bumping, of the third silicon oxide layer can be avoided. Hence, a high yield and a high reliability of the semiconductor device having a double- or multi-level interconnection structure can be achieved.

11 Claims, 4 Drawing Sheets

PROCESS FOR MANUFACTURING A SEMICONDUCTOR DEVICE

BACKGROUND OF THE INVENTION (a) Field of the Invention

The present invention relates to a process for manufacturing a semiconductor device, and more particularly, it relates to a method for planarization of an interlevel dielectric layer in a semiconductor device having a double- or multi-level interconnection structure (referred to as merely a multilevel interconnection structure hereinafter).

(b) Description of the Related Art

Planarization of interlevel dielectric layers has become a necessary step for fabrication of semiconductor devices having a multilevel metal interconnection structure.

A conventional process for fabricating a semiconductor device having a multilevel interconnection structure will be described with reference to FIGS. 1A and 1B. In FIG. 1A, semiconductor active elements not depicted in the drawing are fabricated within a substrate 301, on which a first silicon oxide layer 302 is deposited in a thickness of about 0.5 μm by chemical vapor deposition (CVD). Then, a first level metal interconnect 303 composed of aluminium is formed in a thickness of about 0.7 μm. Next, a second silicon oxide layer 304 is deposited in a thickness of about 0.7 μm by plasma-enhanced chemical vapor deposition (PECVD), following which an organosilica layer 305 is formed by spin-coating accompanied by a thermal treatment, the configuration at the end of this step being shown in FIG. 1A.

The organosilica layer 305 and the second silicon oxide layer 304 are then etched-back for planarization by a dry etching technology, following which a third silicon oxide layer 306 is formed in a thickness of about 0.5 μm partly on the second silicon oxide layer 304 and partly on the organosilica layer 305 by PECVD. Then, through-holes are opened by a conventional photolithographic etching technology, and a second level metal interconnect 307 composed of aluminium is formed, resulting in a double-level interconnection structure, as shown in FIG. 1B. Such a process is described, for example, in a dissertation beginning at Page 506 of "VMIC, CONF PROC", 1986.

With the conventional semiconductor device as described above, the difference between the thickness of the first level metal interconnect 303 and the thickness of the overlying second silicon oxide layer 304 is small, so that portions of the organosilica layer 305 are left, with the spacing thereof being, for example, above 1.5 μm, in order to assure a planarized surface after the etching-back. In such a configuration of the multilevel interconnection structure, however, there is a problem in which the interlevel dielectric layer is not planarized enough, the third silicon oxide layer 306 is liable to delaminate as shown at a reference numeral 308 or liable to blister due to bumping of residual moisture in the organosilica layer. Hence, the overlying aluminium interconnect 307 suffers from an open-circuit failure due to the poor characteristics of the underlying interlevel dielectric layer, thereby degrading the yield of the semiconductor device having a multilevel interconnection structure.

Besides, since the organosilica layer 305 remains in a wide range within the interlevel dielectric layer, the first level aluminium interconnect 303 is subjected to oxidation at the bottom of a through-hole due to the presence of the organosilica compound. Consequently, the first level aluminium interconnect is degraded in its electric characteristics at the bottom of the through-hole, resulting in a short-circuit failure depending on circumstances. Hence, the yield and the reliability of the semiconductor device having a multilevel structure are reduced.

Some other conventional processes employ a sacrificial layer of a photoresist which is completely removed during etching-back the photoresist and an underlying silicon oxide layer. However, it is difficult to control the etch-rate of the underlying layer with a good accuracy and with a high throughput for achieving a well planarized surface of the interlevel dielectric layer. Consequently, there exists a need for an improved process for fabricating a reliable multilevel interconnection structure by a simple treatment and with a high throughput.

SUMMARY OF THE INVENTION

An object of the present invention is to provide a process for manufacturing a semiconductor device having a multilevel interconnection structure in which a high yield and a high reliability of the semiconductor devices can be achieved.

According to the present invention there is provided a process for manufacturing a semiconductor device including steps of: forming a first level interconnect on an insulation layer covering semiconductor active elements fabricated on a substrate; forming a first silicon oxide layer on the first level interconnect and the insulation layer; forming a second silicon oxide layer by atmospheric-pressure CVD on the first silicon oxide layer using tetraethoxysilane (Si(OC$_2$H$_5$)$_4$) and oxygen containing ozone; forming an organic compound coating layer on the second silicon oxide layer by spin-coating; etching-back the organic compound coating layer and the second silicon oxide layer by dry etching to remove the organic compound coating layer; then forming a third silicon oxide layer on the second silicon oxide layer; and forming a second level interconnect on the third silicon oxide layer.

According to the process of the present invention, the second silicon oxide layer, which is formed by the atmospheric-pressure CVD using tetraethoxysilane and oxygen containing ozone, can be well planarized and can be controlled with a good accuracy in its etch-rate. Consequently, the ratio of the etch-rate of the second silicon oxide layer to that of the organic compound coating layer can be controlled well and the well controllable etch-rate of the second silicon oxide layer functions for an excellent planarization effect on the etched-back second silicon oxide layer.

The atmospheric-pressure CVD is preferably carried out under a condition of excess ozone in which the ratio of flow-rate of ozone to flow-rate of tetraethoxysilane is above about 10:1. The second silicon oxide layer is preferably formed in a thickness of about 1.0 μm to 2.0 μm by the atmospheric-pressure CVD.

The organic compound coating layer may contain, as a chief ingredient, at least one of organosilicon compounds including $(R_1)_n$—Si(OH)$_{4-n}$, Si(OR$_2$)$_4$ and $(R_1)_n$—Si(OR$_2$)$_{4-n}$, wherein R1 and R2 are a monovalent hydrocarbon group and an alkyl group, respectively, and n=1, 2 or 3. Otherwise, the organic compound coating layer may contain a photoresist, such as a novolac resin based resist or a polyvinyl phenolic resin based resist, as a chief ingredient.

The organic compound coating layer, when containing at least one of the organosilicon compounds, is preferably formed in an average thickness between about 0.2 μm and about 0.8 μm, i.e., the organic compound is preferably applied in an amount necessary to form a layer in a thickness between 0.2 μm and 0.8 μm on an even or well planarized surface. The organic compound coating layer, when containing a photoresist as a chief ingredient, is preferably formed in an average thickness between about 0.1 μm and about 0.5 μm, i.e., the photoresist is preferably applied in an amount necessary to form a layer in a thickness between 0.1 μm and 0.5 μm on an even surface.

The first silicon oxide layer is preferably formed in a thickness between about 0.03 μm and about 0.5 μm by PECVD, and the third silicon oxide layer is preferably formed in a thickness between about 0.2 μm and about 0.5 μm by PECVD.

BRIEF DESCRIPTION OF THE DRAWINGS

Other and further objects, features and advantages of the present invention will be more apparent from the following description, referring to the accompanying drawings in which.

DESCRIPTION OF THE PREFERRED EMBODIMENTS

Now, the process of the present invention will be described with reference to the drawings.

Figure 2A:
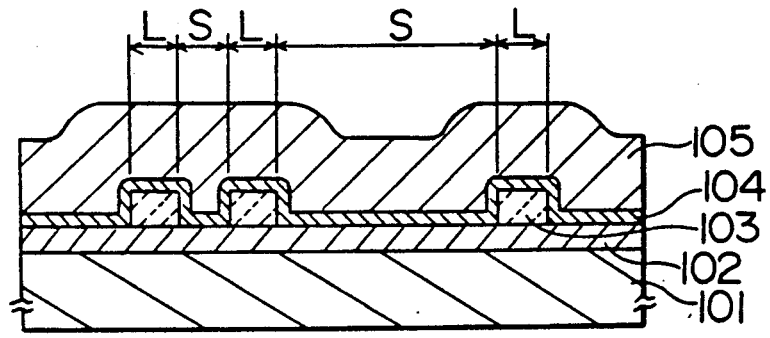
FIGS. 2A to 2E are cross sectional views of a semiconductor device having a double-level interconnection structure showing successive steps in a process according to a first embodiment of the present invention.

FIGS. 2A to 2E each shows a cross-section of a semiconductor device having a double-level interconnection structure at a step in a process according to a first embodiment of the present invention. In FIG. 2A, semiconductor active elements not shown in the drawing are fabricated within the semiconductor substrate 101, on which an insulation layer or first silicon oxide (dioxide) layer 102 is deposited in a thickness of about 0.5 μm by CVD, and a first level aluminium interconnect 103 is formed in a thickness of about 0.7 μm on the first silicon dioxide layer 102.

A second silicon dioxide layer 104 is then deposited in a thickness of about 0.3 μm by PECVD, following which a third silicon dioxide layer 105 is deposited in a thickness of about 1.5 μm by atmospheric-pressure CVD using tetraethoxysilane Si(OC$_2$H$_5$)$_4$ (referred to as TEOS hereinafter) and oxygen containing ozone under a condition of excess ozone in which the ratio of the flow-rate of the ozone to the flow-rate of the TEOS is controlled at about 20:1. FIG. 2A shows the semiconductor device at the end of this step.

Figure 2B:
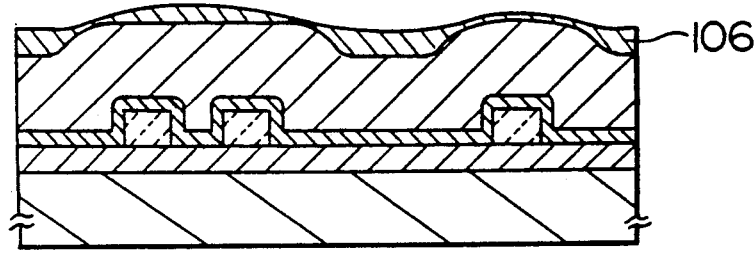

Then, liquid organosilica, the chief ingredient of which is expressed as CH$_3$—Si(OH)$_3$, is coated on the surface of the third silicon dioxide layer 105 for forming a organosilica layer 106 by spin-coating at 3000 rpm accompanied by a thermal treatment, which is carried out for an hour in total under a nitrogen atmosphere at 300° C. The amount of the liquid organosilica applied at this step is equal to the amount as will be applied when an organosilica layer is to be formed in a thickness of about 0.5 μm on a well planarized surface. The organosilica layer 106 is formed thicker at a lower surface of the third silicon dioxide layer 105 than at a higher surface of the third silicon oxide layer 105. FIG. 2B shows the semiconductor device at the end of this step.

Figure 2C:
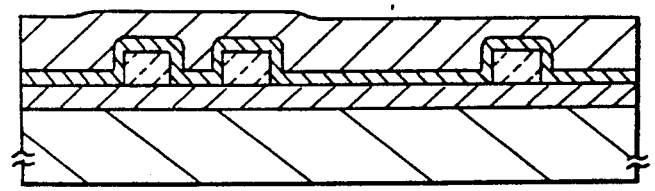
Figure 2D:
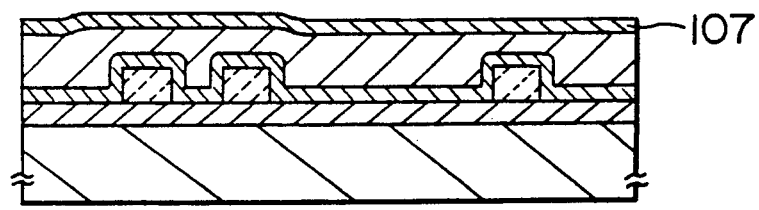
Figure 2E:
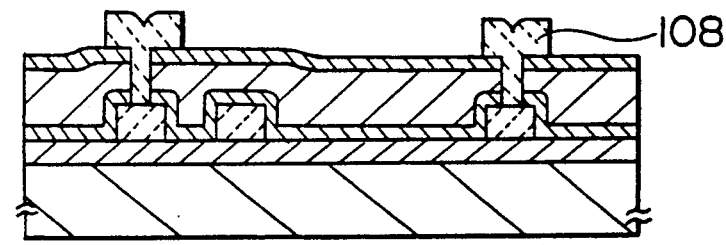

Next, CF$_4$ gas is used for etching-back the organosilica layer 106 and the third silicon dioxide layer 105 by dry-etching to remove the organosilica layer 106 completely. The ratio of the etch-rate of the third silicon dioxide layer 105 to the etch-rate of the organosilica layer 106 during the dry-etching is controlled at about 2:1 under the condition in which flow-rate of CF$_4$ gas is at 30 sccm (standard cubic centimeters per minute), the pressure is at 8.0 Pascal, and the RF-power is at 1200 W. A good planarization effect can be obtained at this etch-rate. The etching-back is carried out until the thickness of the third silicon oxide layer 105 becomes 0.4 μm at the top of the isolated portions of the aluminium interconnect 103, as shown in FIG. 2C. Then, a fourth silicon dioxide layer 107 is deposited in a thickness of about 0.3 μm by PECVD, FIG. 2D showing the semiconductor device at the end of this step. Through-holes are opened by a conventional method using photolithographic technology, and a second level aluminium interconnect 108 is then formed as shown in FIG. 2E.

According to the process of the first embodiment of the present invention, the third silicon dioxide layer, which is formed by the atmospheric-pressure CVD using tetraethoxysilane and oxygen containing ozone, has a lower moisture content, can be formed thick having good characteristics, and hence can be controlled with a good accuracy in its etch-rate. Consequently, the ratio of the etch rate of the third silicon oxide layer to that of the organic compound coating layer can be controlled well.

The organic compound coating layer is formed thick at the lower surface of the third silicon dioxide layer and thin at the higher surface of the third silicon dioxide layer by use of a spin-coating technology, so that the difference of the etch-rate between the organic compound coating layer and the third silicon dioxide layer, as well as the highly controllable etch-rate of the third silicon dioxide layer, functions for a good planarization effect on the etched-back third silicon dioxide layer.

Figure 1A:
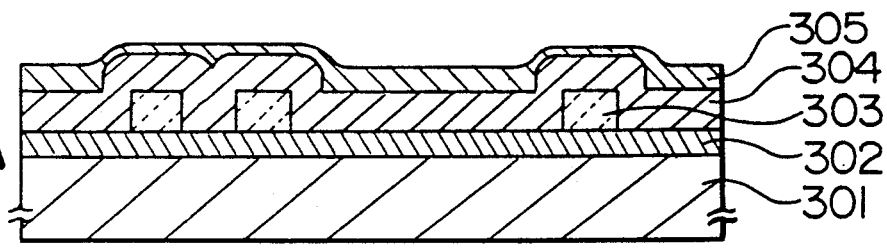
FIGS. 1A and 1B are cross-sectional views of a semiconductor device having a double-level interconnection structure each for showing a step in a conventional process.
Figure 1B:
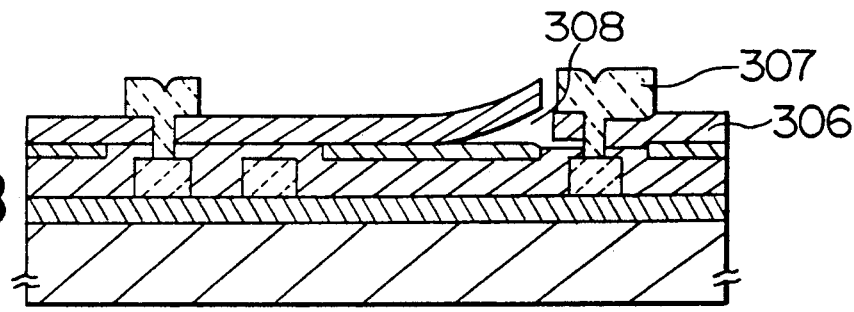
Figure 3:
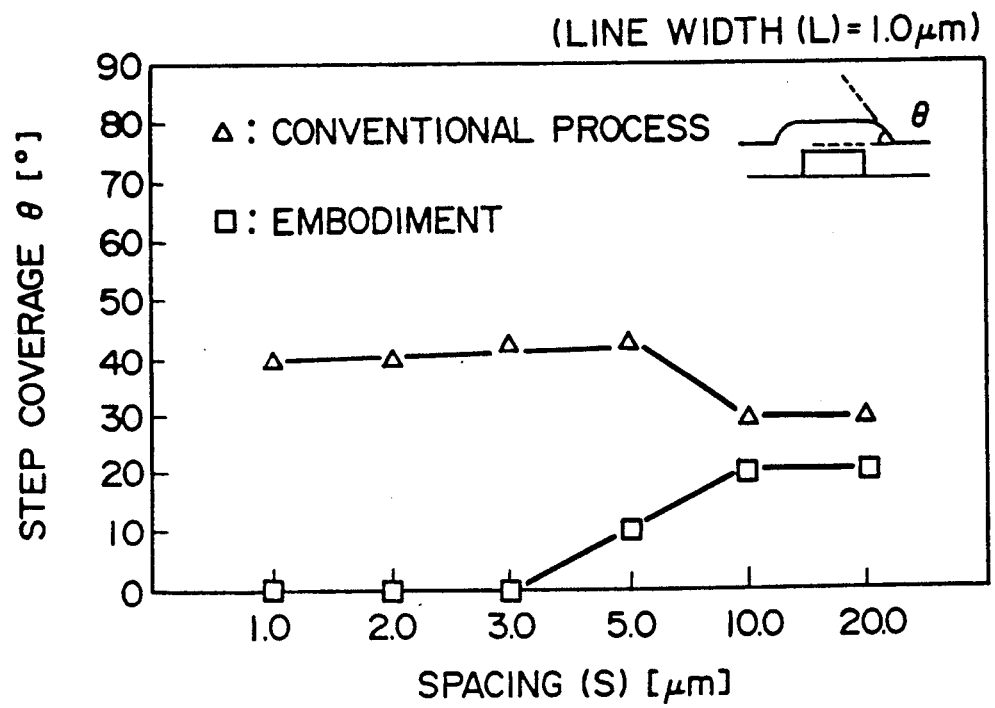
FIG. 3 is a graph for showing a comparison of step coverage of the interlevel dielectric layer formed by the process according to the first embodiment with that by the conventional process.

Semiconductor devices each having a double-level interconnection structure according to the first embodiment were fabricated for testing the characteristics thereof. For the purpose of comparison, other semiconductor devices each having a double-level interconnection structure were also fabricated by the conventional process as described with reference to FIGS. 1A and 1B. FIG. 3 shows characteristics in the step coverage of both the semiconductor devices. The step coverage is represented in terms of maximum inclination angle $\theta$ (degree) at the surface of the interlevel dielectric layer, as schematically depicted in FIG. 3. The step coverage is plotted as a function of the spacing (S) of the lower level aluminium interconnect underlying the interlevel dielectric layer, with the width (L) of the underlying interconnect being 1 $\mu$m.

As shown in FIG. 3, the step coverage ($\theta$) of the interlevel dielectric layer fabricated by the process of the embodiment was extremely small so that it could not be determined at below 3.0 $\mu$m of the spacing (S), and was about 20 degrees at 20 $\mu$m of the spacing, while the step coverage by the conventional process was about 40 degrees at below 5.0 $\mu$m of the spacing, clearly showing an advantage of the process of the embodiment over the conventional process.

Figure 4:
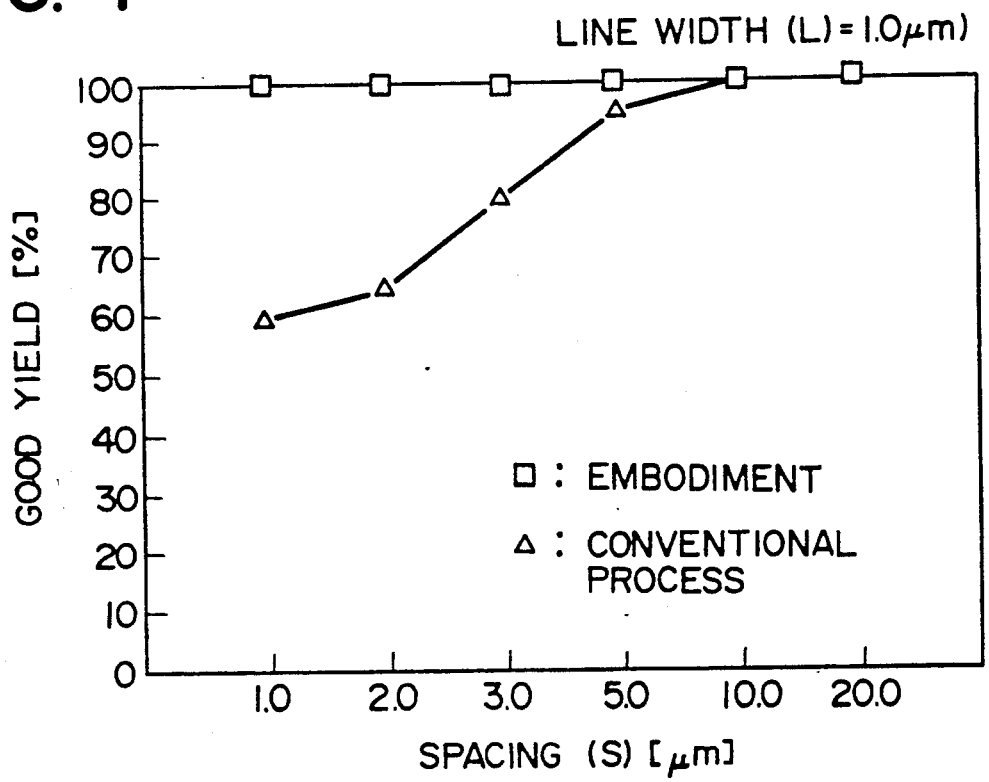
FIG. 4 is a graph for showing a comparison of the ratio of good yield of the aluminium interconnects in a short-circuit test after fabrication by the process of the first embodiment with that by the conventional process.

FIG. 4 is a graph of test results showing the ratio of a good yield of first level interconnects determined in an accelerated reliability test for detecting a short-circuit failure in the first level interconnects having a 1 $\mu$m width. The ratio of the number of good interconnects to overall interconnects is plotted as a function of the spacing (S) of the first level interconnect. FIG. 4 shows that the ratio of the good interconnects in the short-circuit test was 100% over the spacing range between 1.0 $\mu$m and 20 $\mu$m in the semiconductor device fabricated by the process of the first embodiment, while the good yield of the interconnects in the semiconductor device fabricated by the conventional process was below 60% at 1.0 $\mu$m of the spacing, showing an advantage of the process of the embodiment over the conventional process.

The semiconductor device having a double-level interconnection structure fabricated by the first embodiment showed that after the organosilica layer was completely removed, excellent planarization was achieved, and hence a short-circuit or an open-circuit failure in the interconnects was not found during the tests after the fabrication. In addition, the resistance of the through-hole was about 80 m$\Omega$ at a diameter of 1.0 $\mu$m. This value is satisfactory, compared with the conventional process. When the process steps as described above with reference to FIGS. 2A to 2E are repeated, a multilevel interconnection structure can be obtained.

With the semiconductor device fabricated by the first embodiment, although the thickness of the second silicon dioxide layer 104 is exemplified as 0.3 $\mu$m, the thickness of the second oxide layer 104 may be selected between about 0.03 $\mu$m and about 0.5 $\mu$m. Similarly, the third silicon dioxide layer 105 formed by atmospheric-pressure CVD using TEOS and oxygen containing ozone may be selected between about 1.0 $\mu$m and about 2.0 $\mu$m, although it is exemplified as about 1.5 $\mu$m in the first embodiment. The thickness of the fourth silicon dioxide layer 107 deposited by PECVD may be also selected between about 0.2 $\mu$m and about 0.5 $\mu$m, although it is exemplified as about 0.3 $\mu$m in the first embodiment.

Further, with the semiconductor device fabricated by the first embodiment, the organic compound coating layer is formed by spin-coating of liquid organosilica compound the chief ingredient of which is $CH_3$—Si(OH)$_3$. The organic compound coating layer, however, may comprise as a chief ingredient at least one of organosilica compounds including $(CH_3)_2$—Si(OH)$_2$, $(CH_3)_3$—Si(OH), Si(OC$_2$H$_5$)$_4$, $CH_3$—Si(OC$_2$H$_5$)$_3$, $(CH_3)_2$—Si(OC$_2$H$_5$)$_2$ and $(CH_3)_3$—Si(OC$_2$H$_5$). Besides, although the metal interconnect is exemplified as an aluminium interconnect, similar advantage may be obtained by using an interconnect composed of at least one of an aluminium alloy, a titanium alloy, tungsten, gold and polycrystalline silicon.

Figure 5A:
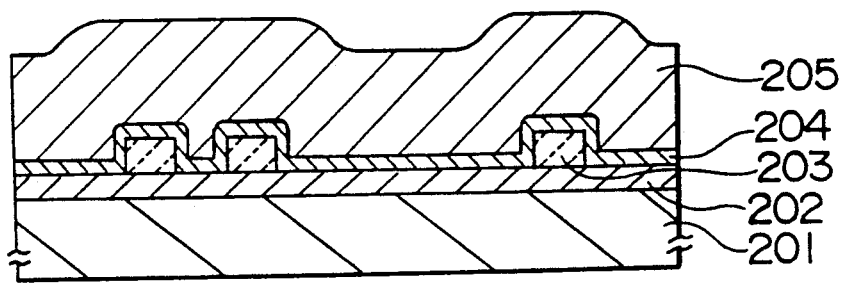
FIGS. 5A to 5E are cross-sectional views of a semiconductor device showing successive steps in a process according to a second embodiment of the present invention.

FIGS. 5A to 5E each shows a cross-section of a semiconductor device having a double-level interconnection structure at successive steps in a process according to a second embodiment of the present invention. In FIG. 5A, semiconductor active elements not shown in the drawing are fabricated within the semiconductor substrate 201, on which a first silicon dioxide layer 202 is deposited in a thickness of about 0.5 $\mu$m by CVD, and a first level aluminium interconnect 203 is formed in a thickness of about 0.7 $\mu$m on the first silicon dioxide layer 202. A second silicon dioxide layer 204 is then deposited in a thickness of about 0.03 $\mu$m by PECVD, following which a third silicon dioxide layer 205 is deposited in a thickness of about 2.0 $\mu$m, as shown in FIG. 5A, by atmospheric-pressure CVD in which TEOS and oxygen containing ozone are used under the condition of excess ozone in which the concentration of ozone is 120 g/N2 SLM (standard liter per minute) and the flow-rate of TEOS is 1 SLM, i.e., the ratio of the flow-rate of ozone to that of TEOS is 20:1.

Figure 5B:
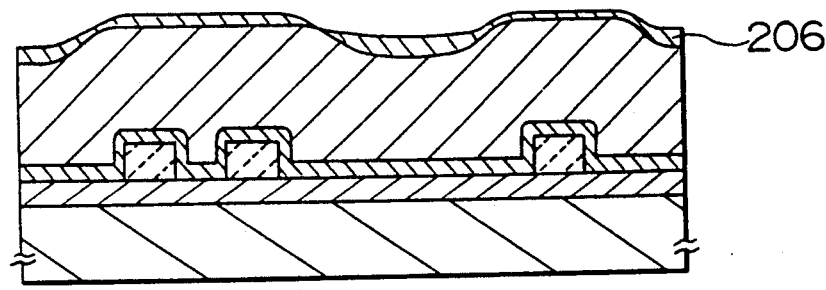

Then, a photoresist, such as novolac resin based resist, is coated by spin-coating and baked to form a resist layer 206, as shown in FIG. 5B. The average thickness of the photoresist layer is about 0.2 $\mu$m, i.e., the amount of the resist applied in this step is equal to the amount as will be applied when a resist layer in a thickness of 0.2 $\mu$m is to be formed on a planarized surface.

Figure 5C:
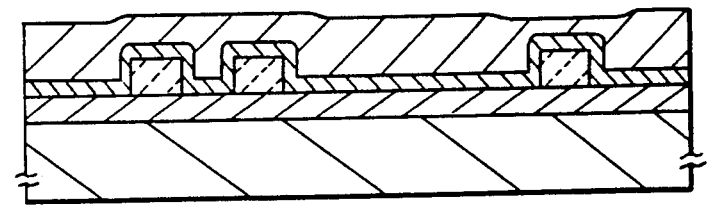

Next, $CF_4$ gas is used for etching-back the photoresist layer 206 and the third silicon oxide layer 205 by dry-etching to remove the photoresist layer 206 completely. In this step, the ratio of the etch-rate of the third silicon dioxide layer 205 to that of the photoresist layer 206 during the dry-etching is controlled at about 3:1 with a good accuracy, under the condition in which the flow-rate and the pressure of the $CF_4$ gas is 3 sccm and 8.0 Pascal, respectively, and the RF-power is at 1200 W. A good planarization effect can be obtained at this etch-rate. The etching-back is carried out until the thickness of the third silicon oxide layer 205 becomes 0.3 $\mu$m at the top of the isolated portions of the first level aluminium interconnect 203. FIG. 5C shows the semiconductor device at the end of this step.

Figure 5D:
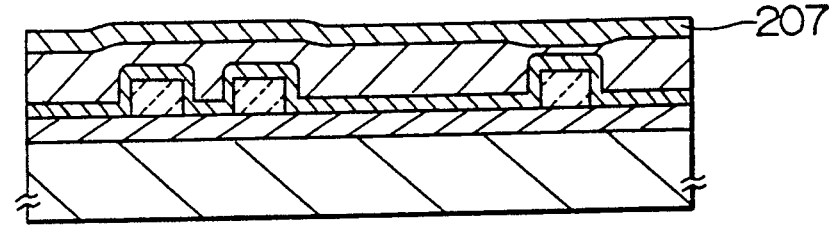
Figure 5E:
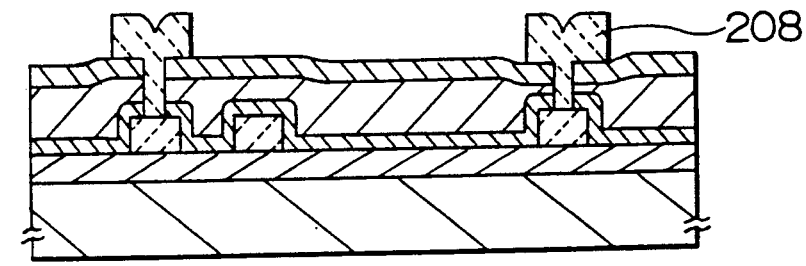

Then, a fourth silicon dioxide layer 207 is deposited in a thickness of about 0.4 $\mu$m by PECVD, as shown in FIG. 5D. Through-holes are then opened by a conventional method using a photolithographic technology, and a second level aluminium interconnect 208 is formed as shown in FIG. 5E.

The semiconductor device having a double-level interconnection structure fabricated by the second embodiment showed that after the organosilica layer is completely removed, excellent planarization is achieved, and hence a short-circuit or open-circuit failure in the interconnects is not found in the tests carried out after the fabrication. In addition, the resistance of the through-hole was 80 m$\Omega$ at a diameter of 1.0 $\mu$m. This is satisfactory, compared with the conventional process. When the steps as described above with reference to FIGS. 5A to 5E are repeated, a multilevel interconnection structure can be obtained.

Since the above embodiments are described only for examples, the present invention is not limited to such embodiments and it will be obvious for those skilled in the art that various modifications or alterations can be easily made based on the above embodiments within the scope of the present invention.

What is claimed is:

1. A process for manufacturing a semiconductor device including steps of: forming a first level interconnect on an insulation layer covering semiconductor active elements fabricated on a substrate; forming a first silicon oxide layer on said first level interconnect and said insulation layer; forming a second silicon oxide layer by atmospheric-pressure CVD on said first silicon oxide layer using tetraethoxysilane ($Si(OC_2H_5)_4$) and oxygen containing ozone, the ratio of the flow-rate of ozone to the flow-rate of tetraethoxysilane being above about 10:1; forming an organic compound coating layer on said second silicon oxide layer by spin-coating; etching-back said organic compound coating layer and said second silicon oxide layer by dry etching to remove the organic compound coating layer; after said etching-back, forming a third silicon oxide layer on said second silicon oxide layer; and forming a second level interconnect on said third silicon oxide layer.

2. A process for manufacturing a semiconductor device as defined in claim 1, wherein said second silicon oxide layer is formed in a thickness of about 1.0 $\mu$m to 2.0 $\mu$m by said atmospheric-pressure CVD.

3. A process for manufacturing a semiconductor device as defined in claim 1, wherein said second silicon oxide layer is etched-back at a higher etch rate than said organic compound coating layer during said etching-back.

4. A process for manufacturing a semiconductor device as defined in claim 1, wherein said organic compound coating layer contains at least one organosilicon compound as a main ingredient.

5. A process for manufacturing a semiconductor device as defined in claim 1, wherein said organic compound coating layer has an average thickness between about 0.2 $\mu$m and about 0.8 $\mu$m.

6. A process for manufacturing a semiconductor device as defined in claim 1, wherein said organic compound coating layer contains as a main gradient at least one member selected from the group consisting of $(R_1)_n-Si(OH)_{4-n}$, $Si(OR_2)_4$ and $(R_1)_n-Si(OR_2)_{4-n}$, wherein R1 and R2 are a monovalent hydrocarbon group and an alkyl group, respectively, and n=1, 2 or 3.

7. A process for manufacturing a semiconductor device as defined in claim 1, wherein said organic compound coating layer contains a photoresist as a main ingredient.

8. A process for manufacturing a semiconductor device as defined in claim 7, wherein said photoresist is a member selected from the group consisting of novolac resin based resist and polyvinyl phenolic resin based resist.

9. A process for manufacturing a semiconductor device as defined in claim 7, wherein said organic compound coating layer has an average thickness between about 0.1 $\mu$m and about 0.5 $\mu$m.

10. A process for manufacturing a semiconductor device as defined in claim 1, wherein said first silicon oxide layer has a thickness between about 0.03 $\mu$m and about 0.5 $\mu$m and is formed by plasma-enhanced CVD.

11. A process for manufacturing a semiconductor device as defined in claim 1, wherein said third silicon oxide layer has a thickness between about 0.2 $\mu$m and about 0.5 $\mu$m and is formed by plasma-enhanced CVD.

* * * * *